(12) United States Patent
Nittala et al.

(10) Patent No.: US 10,224,951 B2
(45) Date of Patent: Mar. 5, 2019

(54) CONFIGURABLE INPUT RANGE FOR CONTINUOUS-TIME SIGMA DELTA MODULATORS

(71) Applicant: Analog Devices Global, Hamilton (BM)

(72) Inventors: Venkata Aruna Srikanth Nittala, Bengaluru (IN); Avinash Gutta, Bangalore (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/276,561

(22) Filed: Sep. 26, 2016

(65) Prior Publication Data

US 2017/0201270 A1   Jul. 13, 2017

Related U.S. Application Data

(63) Continuation of application No. 62/276,704, filed on Jan. 8, 2016.

(51) Int. Cl.
*H03M 3/02* (2006.01)
*H03M 3/00* (2006.01)
*H03M 1/10* (2006.01)

(52) U.S. Cl.
CPC ......... *H03M 3/322* (2013.01); *H03M 1/1009* (2013.01); *H03M 3/30* (2013.01); *H03M 3/486* (2013.01); *H03M 3/43* (2013.01); *H03M 3/456* (2013.01)

(58) Field of Classification Search
CPC ...... H03M 3/464; H03M 3/30; H03M 1/1009; H03M 3/322; H03M 3/422

USPC .................................................. 341/143, 120
See application file for complete search history.

(56) References Cited

U.S. PATENT DOCUMENTS

| 4,584,558 A | * | 4/1986 | Maschek | ................. | H03M 1/48 324/115 |
| 6,975,259 B1 | * | 12/2005 | Jensen | ................. | H03M 3/478 341/143 |
| 8,199,038 B2 | * | 6/2012 | Kim | ........................ | G06G 7/186 327/344 |
| 8,754,795 B2 | * | 6/2014 | Baker | ................. | G11C 11/5642 341/130 |

(Continued)

FOREIGN PATENT DOCUMENTS

CN          202856717 U    4/2013
CN          103499991 B    1/2016
(Continued)

*Primary Examiner* — Brian K Young
(74) *Attorney, Agent, or Firm* — Schwegman Lundberg & Woessner, P.A.

(57) ABSTRACT

A continuous-time sigma delta modulator circuit includes a scaling circuit that scales an input analog signal by a selectable range of different scaling factors in order to change a range of signal levels of the input analog signal to a desired range of signal levels in a scaled analog signal prior to conversion of the scaled analog signal to a digital signal. The scaling factor is selected based on the range of signal levels of the input analog signal in order to provide signal levels of the scaled signal within a desired range. The scaling circuit maintains current flow of the input analog signal at a substantially constant level regardless of the different scaling factors that are used to scale the input analog signal.

28 Claims, 8 Drawing Sheets

(56) References Cited

U.S. PATENT DOCUMENTS

| | | | |
|---|---|---|---|
| 8,779,958 B1 | 7/2014 | Maurino et al. | |
| 8,860,491 B1 * | 10/2014 | Li | H03M 3/442 |
| | | | 327/336 |
| 8,937,567 B2 * | 1/2015 | Obata | H03F 3/45076 |
| | | | 341/143 |
| 8,947,280 B2 * | 2/2015 | Wulff | H03M 3/39 |
| | | | 341/118 |
| 9,024,795 B2 * | 5/2015 | Muthers | H03M 3/322 |
| | | | 341/143 |
| 9,065,477 B2 | 6/2015 | Rajasekhar et al. | |
| 9,106,255 B1 | 8/2015 | Zhang et al. | |
| 9,148,168 B2 * | 9/2015 | Li | H03M 3/368 |
| 9,294,120 B2 * | 3/2016 | Zhang | H03M 3/422 |
| 9,537,497 B2 * | 1/2017 | Ho | H03M 1/06 |

FOREIGN PATENT DOCUMENTS

| | | |
|---|---|---|
| DE | 102005020067 B4 | 4/2008 |
| KR | 10-2009-0109454 | 10/2009 |

* cited by examiner

CONFIGURABLE INPUT RANGE FOR CONTINUOUS-TIME SIGMA DELTA MODULATORS

CLAIM OF PRIORITY

This application claims priority to U.S. Provisional Patent Application No. 62/276,704, filed Jan. 8, 2016, which is hereby incorporated by reference herein in its entirety.

FIELD OF THE DISCLOSURE

The present disclosure relates to the field of sigma delta modulator circuits.

BACKGROUND

Many applications include sigma delta modulators in a signal path, such as in an analog to digital converter. In sigma delta modulators, quantization is performed in a manner so as to reduce the noise imparted by quantization in the frequency range of the signal while still maintaining sufficient gain for the signal. Continuous-time sigma delta modulators are one approach of implementing such a modulator. Continuous-time sigma delta modulators perform integration on a continuous-time signal prior to sampling.

SUMMARY OF THE DISCLOSURE

This overview is intended to provide an overview of subject matter of the present patent application. It is not intended to provide an exclusive or exhaustive explanation of the invention. The detailed description is included to provide further information about the present patent application.

According to an embodiment, a continuous-time sigma delta modulator (CTSDM) circuit includes a scaling circuit that scales an input analog signal by a selectable range of different scaling factors in order to change a range of signal levels of the input analog signal to a desired range of signal levels in a scaled analog signal prior to conversion of the scaled analog signal to a digital signal. The scaling factor is selected based on the range of signal levels of the input analog signal in order to provide signal levels of the scaled signal within a desired range. The scaling circuit maintains current flow of the input analog signal at a substantially constant level regardless of the different scaling factors that are used to scale the input analog signal.

According to an embodiment, a CTSDM circuit includes an integrating amplifier circuit having a first amplifier input and a first amplifier output, a quantizer circuit having a first quantizer input coupled with the first amplifier output and having a quantizer output to provide a digital output signal, a digital to analog converter (DAC) circuit having a digital input coupled with the quantizer output and having a first analog output coupled with the first amplifier input at a first summing node, and a scaling circuit coupled between a first analog signal input and the first summing node. The scaling circuit is configured to provide a selectable scaling factor to adjust a signal range of an input signal provided at the analog signal input to provide a range-adjusted input signal to the first summing node. The selectable scaling factor is selectable according to a scaling control input signal. The scaling circuit also includes at least one switch arranged to reconfigure an impedance network to maintain a substantially constant input current at the analog signal input across two or more selectable scaling factors. The at least one switch is controlled according to the scaling control input signal.

According to an embodiment, a method of scaling an input signal to an integrating amplifier includes providing a CTSDM circuit including a scaling circuit having a first analog signal input and having a first scaled output coupled with a first summing node, an integrating amplifier circuit having a first amplifier input coupled with the first summing node and having a first amplifier output, a quantizer circuit having a first quantizer input coupled with the first amplifier output and having a quantizer output to provide a digital output signal, and a digital to analog converter (DAC) circuit having a digital input coupled with the quantizer output and having a first analog output coupled with the first summing node. The method also includes selectively establishing a scaling factor of the scaling circuit to adjust a signal range of an input signal provided at the first analog signal input to provide a range-adjusted input signal to the first summing node. The selectable scaling factor is electable according to a scaling control input signal. The method also includes reconfiguring an impedance network of the scaling circuit by at least one switch to maintain a substantially constant input current at the first analog signal input across two or more selectable scaling factors. The at least one switch is controlled according to the scaling control input signal.

Figure 1:
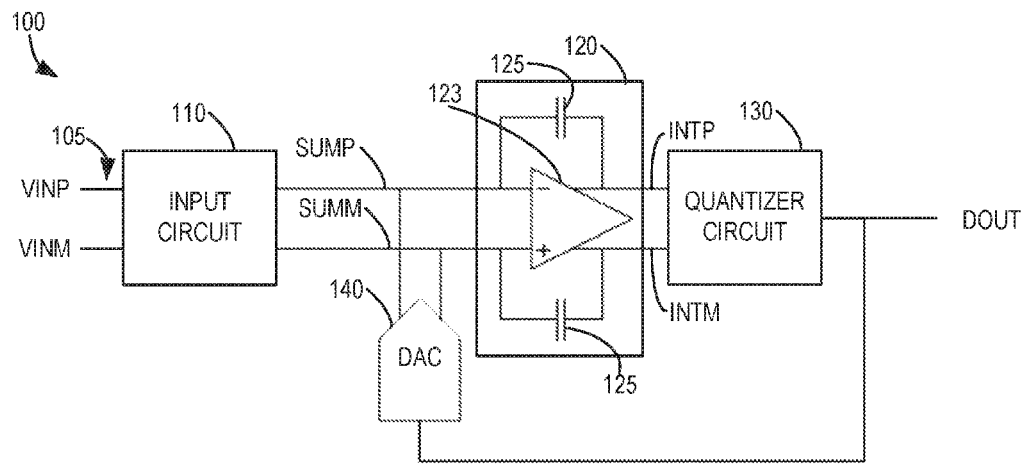
FIG. 1 is a circuit schematic that illustrates a continuous-time sigma delta modulator (CTSDM) circuit to provide improved acceptance of input signals of varying signal ranges or other characteristics, according to an embodiment.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that problems arise with the use of a continuous-time sigma delta modulator with input signals of varying signal ranges or other characteristics. For example, the input stage of a continuous-time sigma delta modulator is typically configured to have operational characteristics related to performance and reliability that are dependent upon receiving an input signal having signal levels within a predetermined range of values. Input signals having signal levels outside this range may result in poor performance, such as inducing distortion, or even causing a breakdown of the modulator, such as due to electrical overstress.

Prior approaches to enabling input signals of varying signal ranges for a continuous-time sigma delta modulator include the use of high voltage circuitry or merely accepting poor performance, such as poor noise performance at lower input signal amplitude ranges, poor distortion performance at higher input signal amplitude ranges, e.g., due to non-linearity at higher input signal ranges. However, the use of high voltage circuitry typically involves introduction of other limitations, such as related to cost and performance, and merely accepting poor performance may not always be a possibility in the pursuit of satisfying increasingly stringent system specifications.

Therefore, a need exists for a continuous-time sigma delta modulator and other modulator and analog to digital converter circuits that accept input signals having signal levels within varying ranges or other characteristics while maintaining operational specifications related to performance (e.g., one or more of noise and linearity) and reliability.

FIG. 1 is a circuit schematic that illustrates a continuous-time sigma delta modulator (CTSDM) circuit 100 to provide improved acceptance of input signals of varying signal ranges or other characteristics, according to an embodiment. The CTSDM circuit 100 may be used to implement an analog to digital converter (ADC) such as a sigma delta ADC (SDADC). The CTSDM circuit 100 may include a configurable input circuit 110, a continuous-time integrator circuit 120, a quantizer circuit 130, and a digital to analog converter (DAC) circuit 140.

The configurable input circuit 110 may also be referred to as a scaling circuit, because the configurable input circuit 110 may receive one or more analog input signals (e.g., differential input signal pair VINP and VINM) via corresponding one or more input terminals 105, provide a selectable scaling (e.g., attenuation) factor to adjust a signal range of the received analog input signals, and provide one or more scaled analog input signals (e.g., scaled differential signal pair VINPs and VINMs) based on the received analog input signals and the selectable scaling factor. The configurable input circuit 110 may provide configurable scaling to the analog input signals to enable other components of the CTSDM 100 to operate within predetermined signal range specifications.

In various embodiments, the configurable input circuit 110 may include a plurality of selectable scaling elements to provide scaling to the analog input signals. The plurality of selectable scaling elements may include an impedance network having one or more impedance elements and one or more switches controlled by one or more selection inputs to reconfigure the impedance network by modifying electrical current paths through the impedance network. The impedance network may be reconfigurable to maintain a substantially constant input current at the input terminals 105 across two or more selectable scaling factors. The input current may be considered to be substantially constant when a variation in the input current across the two or more selectable scaling factors is less than 10%, less than 5%, less than 1%, or less than another specified value. Maintaining the input current at a substantially constant level may improve the performance of the embodiments of the CTSDM circuit 100, such as by providing consistent bias currents for the integrator circuit 120 across a variety of input signal magnitudes.

One or more summing nodes (e.g., differential summing node pair SUMP and SUMM) may receive the scaled input signals from the configurable input circuit 110 and respective analog signal outputs of the DAC circuit 140, and sum the signals received at the summing nodes.

The continuous-time integrator circuit 120 may also be referred to as an integrating amplifier. The continuous-time integrator circuit 120 may receive the summed signals from the respective summing nodes and provide one or more integrated signals (e.g., differential integrated signal pair INTP and INTM) based on the summed signals from the respective summing nodes. The continuous-time integrator circuit 120 may include an operational amplifier 123 and one or more integrator capacitors 125 that couple outputs (e.g., INTP, INTM) of the operational amplifier 123 and the continuous-time integrator circuit 120 with respective inputs of the operational amplifier 123 and the continuous-time integrator circuit 120 at the summing nodes (e.g., SUMP, SUMM).

The quantizer circuit 130 may receive the integrated signals (e.g., INTP, INTM) and provide a quantized digital output signal DOUT based on the received integrated signals. The DAC circuit 140 may receive the quantized digital output signal DOUT, and provide the analog signal outputs to the summing nodes based on the received quantized digital output signal DOUT.

The selection inputs that control the individual switches of the configurable input circuit 110 may be included in or generated from a scaling control input signal, which may be provided by a controller having a processor to execute computing instructions for controlling the configurable input circuit 110. An amount of scaling to perform by the configurable input circuit 110 may be determined by the controller according to sensed voltage values at the one or more input terminals 105 or other nodes within the CTSDM 100. The controller may determine the sensed voltage values according to the quantized digital output signal DOUT.

Figure 2:
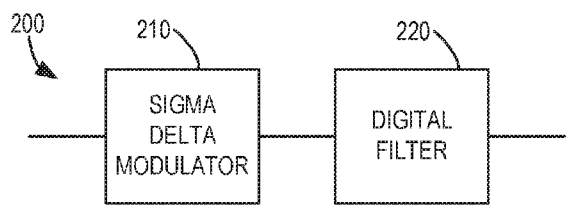
FIG. 2 is a circuit schematic that illustrates a sigma delta analog to digital converter (ADC) circuit, according to an embodiment.

FIG. 2 is a circuit schematic that illustrates a SDADC circuit 200, according to an embodiment. The SDADC 200 may include the CTSDM circuit 210 and a digital filter circuit 220. The CTSDM circuit 210 may be an embodiment of the CTSDM circuit 100. In various embodiments, the SDADC circuit 200 may be an oversampling SDADC, in which the CTSDM circuit 210 may produce a digital signal at a data rate corresponding to an over-sampled sample clock rate and the digital filter circuit 220 may be a decimating digital filter.

Figure 3:
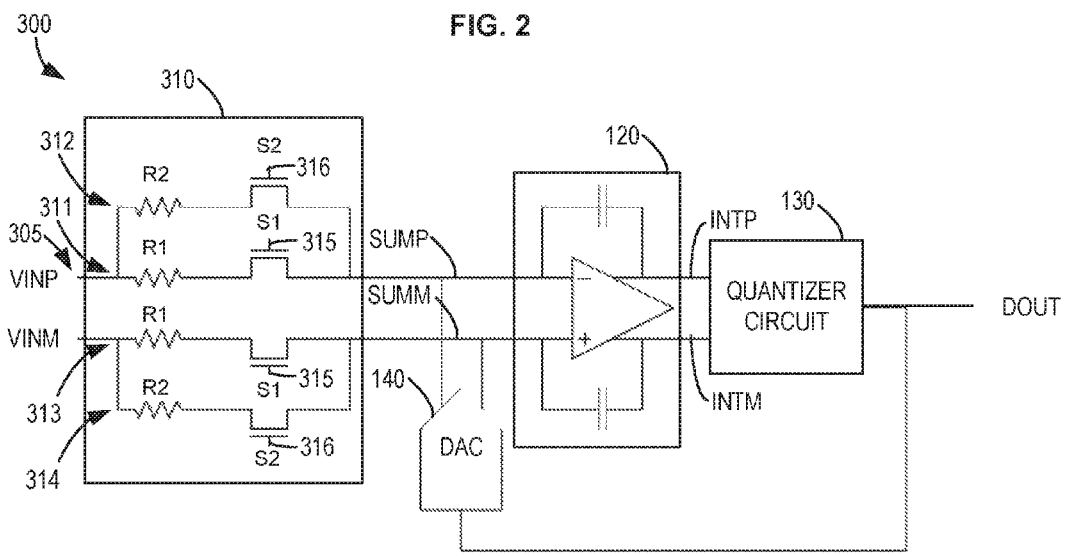
FIG. 3 is a circuit schematic that illustrates a CTSDM circuit to provide improved acceptance of input signals of varying signal ranges or other characteristics, according to an embodiment.

FIG. 3 is a circuit schematic that illustrates a CTSDM circuit 300 to provide improved acceptance of input signals of varying signal ranges or other characteristics, according to an embodiment. The CTSDM circuit 300 may be an embodiment of the CTSDM circuit 100, showing additional details of a configurable input circuit 310 according to the embodiment. In FIG. 3, the configurable input circuit 310 may include a pair of input terminals 305 connected to differential input signal pair VINP and VINM, a pair of output terminals connected to summing nodes SUMP and SUMM, and a plurality of selectable impedance branches (e.g., branches 311-312 and branches 313-314). The pair of input terminals 305 may receive a differential input signal and provide each polarity of the differential input signal to a plurality of different selectable impedance branches. For example, VINP may be provided to selectable impedance branches 311-312, while VINM may be provided to selectable impedance branches 313-314. The plurality of selectable impedance branches 311-312 and 313-314 may receive the differential input signal (e.g., VINP and VINM) from the input terminals 305, and provide a scaled version of the differential input signal to the output terminals, and consequently to the summing nodes (e.g., SUMP and SUMM).

Each of the plurality of selectable impedance branches 311-312 and 313-314 may include an impedance, such as a resistor (e.g., one of resistors R1, R2) having a predetermined resistance value, and a switch (e.g., one of switches S1, S2) connected in series between the input terminal and the output terminal. Each switch S1, S2 may include a transistor configured with a corresponding selection input, allow the signal to pass through in response to a first state of the selection input, and prevent the signal from passing in response to a second state of the selection input. The plurality of selectable impedance branches 311-312 and 313-314 may provide the output terminals of the configurable input circuit 310 the scaled differential input signal, which in turn may be provided to the summing nodes (e.g., SUMP and SUMM) leading to the input of the continuous-time integrator circuit 120.

In operation, the configurable input circuit 310 may effectively convert a voltage input signal to a current signal scaled to a degree based on the selection inputs provided to the configurable input circuit 310. Providing the input signal scaled to a selectable degree may enable the CTSDM circuit 300 to accept input signals of varying signal ranges while still providing a signal to the summing nodes before the continuous-time integrator circuit 120 at a level within operational specifications for this circuit related to performance and reliability.

For example, in FIG. 3, in response to the first selection input 315 enabling, i.e., turning on, the selection switches S1 in a first set of the impedance branches 311 and 313, and the second selection input 316 disabling, i.e., turning off, the selection switches S2 in a second set of the impedance branches 312 and 314, the configurable input circuit 310 may convert the input signal to a current signal at scaling determined by the value of first resistors R1 of the first set of impedance branches 311 and 313. In response to the first selection input 315 disabling the selection switches S1 in the first set of impedance branches 311 and 313, and the second selection input 316 enabling the selection switches S2 in the second set of impedance branches 312 and 314, the configurable input circuit 310 may convert the input signal to a current signal at a scaling determined by the value of second resistors R2 of the second set of impedance branches 312 and 314. In response to the first and second selection inputs 315 and 316 enabling the selection switches S1 and S2 in both the first and second sets of impedance branches 311, 313 and 312, 314, the configurable input circuit 310 may convert the input signal to a current signal at a scaling determined by the values of both the first and second resistors R1 and R2 of the first and second sets of impedance branches 311, 313 and 312, 314.

As can be seen, the values of the impedances of the plurality of impedance branches 311-312 and 313-314 may be chosen to provide predetermined degrees of scaling to the input signal. In one embodiment, the impedance values may be chosen to be substantially the same in all of the impedance branches 311-312 and 313-314, and different degrees of scaling may be provided by enabling different numbers of impedance branches 311-312 and 313-314 between paired input and output terminals. In another embodiment, the impedance values for different branches between paired input and output terminals may be chosen to be different, and different degrees of scaling may be provided by enabling different single impedance branches between the input and output terminals.

While the input circuit 310 uses individual selectable impedances connected in parallel, other embodiments of the input circuit 310 or the input circuit 110 may include other configurations to provide the selectable scaling of the input signal. For example, in other embodiments, the impedance branches 311-314 may include series-connected impedances to provide the selectable scaling.

Figure 4:
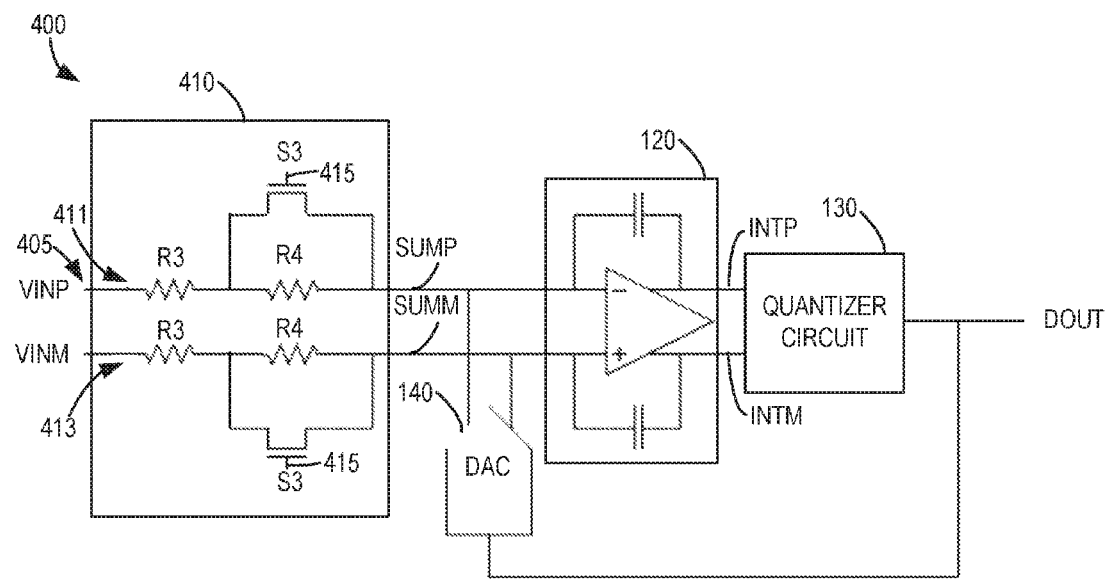
FIG. 4 is a circuit schematic that illustrates a CTSDM circuit to provide improved acceptance of input signals of varying signal ranges or other characteristics, according to another embodiment.

FIG. 4 is a circuit schematic that illustrates a CTSDM 400 circuit to provide improved acceptance of input signals of varying signal ranges or other characteristics, according to another embodiment. The CTSDM circuit 400 may be an embodiment of the CTSDM circuit 100 or CTSDM circuit 300, showing additional details of a configurable input circuit 410 according to the embodiment. In FIG. 4, the configurable input circuit 410 may include a pair of input terminals 405 connected to differential input signal pair VINP and VINM, a pair of output terminals connected to summing nodes SUMP and SUMM, and a plurality of impedance branches (e.g., 411 and 413). The plurality of impedance branches may receive the differential input signal from the input terminals 405, and provide a scaled version of the differential input signal to the output terminals, and consequently to the summing nodes (e.g., SUMP and SUMM). Each of the impedance branches may include a plurality of impedances, such as a plurality of resistors (e.g., R3 and R4) having predetermined resistance values, and at least one switch (e.g., S3) connected in parallel with at least one of the impedances (e.g., R4).

In operation, in response to the selection input 415 enabling the selection switches S3, the configurable input circuit 410 may convert the input signal to a current signal at a scaling determined by the value of first resistors R3 of the impedance branches 411 and 413. In response to the selection input 415 disabling the selection switches S3 in the impedance branches 411 and 413, the configurable input circuit 410 may convert the input signal to a current signal at a scaling determined by the value of both the first and second resistors R3, R4 of the impedance branches 411 and 413.

While the input circuit 410 uses individual selectable impedances connected in series, other embodiments of the input circuit 410, the input circuit 310, or the input circuit 110 may include other configurations to provide the selectable scaling of the input signal. For example, in other embodiments, selection between one or more scaling factors may be specifically defined by the configurable input circuit and one or more scaling factors defined outside of the configurable input circuit.

Figure 5:
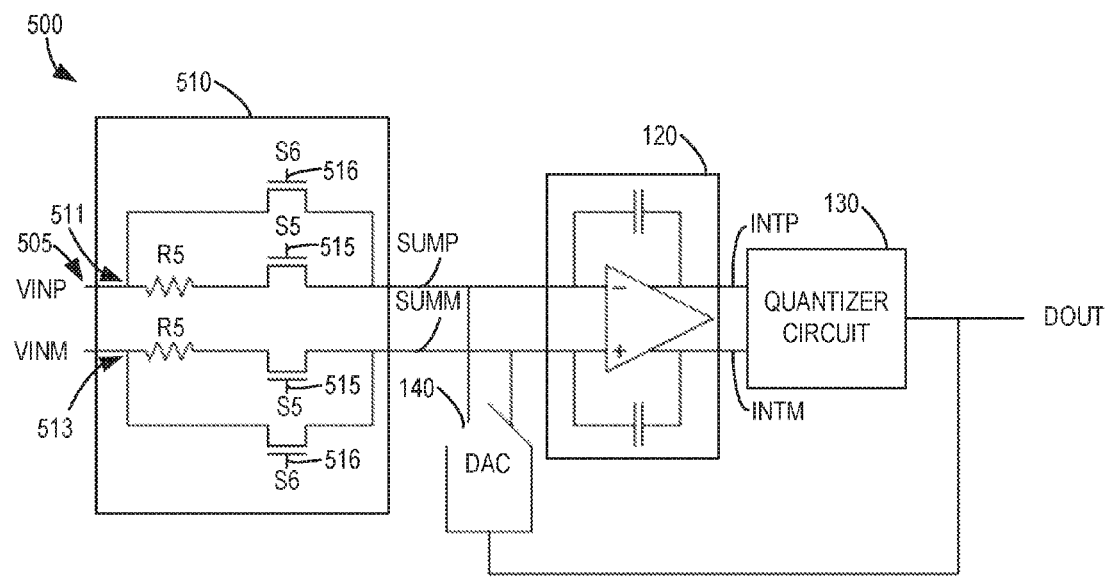
FIG. 5 is a circuit schematic that illustrates a CTSDM circuit to provide improved acceptance of input signals of varying signal ranges or other characteristics, according to yet another embodiment.

FIG. 5 is a circuit schematic that illustrates a CTSDM circuit 500 to provide improved acceptance of input signals of varying signal ranges or other characteristics, according to yet another embodiment. The CTSDM circuit 500 may be an embodiment of the CTSDM circuit 100, CTSDM circuit 300, or CTSDM circuit 400, showing additional details of a configurable input circuit 510 according to the embodiment. In FIG. 5, a configurable input circuit 510 may include a pair of input terminals 505 connected to differential input signal pair VINP and VINM, a pair of output terminals connected to summing nodes SUMP and SUMM, and a plurality of impedance branches (e.g., 511 and 513). The plurality of impedance branches may receive the differential input signal from the input terminals 505, and provide a scaled version of the differential input signal to the output terminals, and consequently to the summing nodes (e.g., SUMP and SUMM). Each of the impedance branches may include an impedance, such as a resistor (e.g., R5) having a predetermined resistance value, and a switch (e.g., S5) connected in series with the impedance between the input and output terminal, and a switch (e.g., S6) connected in parallel with the impedance and other switch between the input and output terminal.

In operation, in response to a first section signal 515 enabling the first selection switches S5, and a second selection input 516 disabling the second selection switches S6, the configurable input circuit 510 may convert the input signal to a current signal at a scaling determined by the value of first resistors R5 of the impedance branches 511 and 513. In response to the second selection input 516 enabling the second selection switches S6, the configurable input circuit 510 may deliver a signal at a scaling determined outside of the configurable input circuit 510, such as by a circuit delivering the differential input signal (e.g., VINP and VINM) to the configurable input circuit 510 or otherwise.

While the input circuit 510 uses individual selectable impedances connected in series with the input terminals 505 permitting signal scaling to be performed outside of the configurable input circuit 510, other embodiments of the input circuit 510, the input circuit 410, the input circuit 310, or the input circuit 110 may include other configurations to provide the selectable scaling of the input signal. For example, in other embodiments, the configurable input circuit may define a plurality of different scaling factors to a plurality of different input terminals 505.

Figure 6:
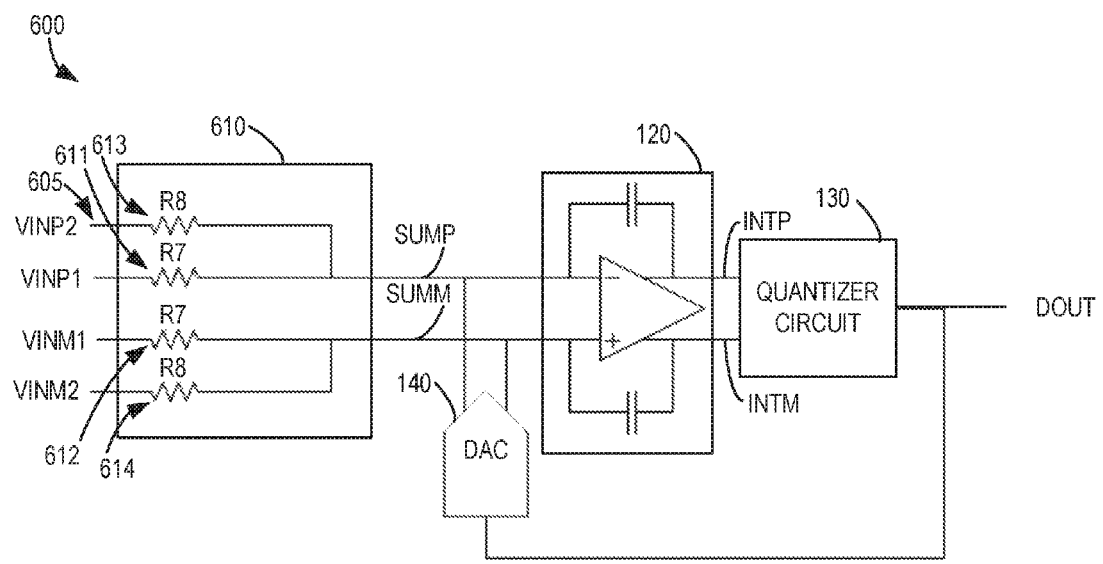
FIG. 6 is a circuit schematic that illustrates a CTSDM circuit to provide improved acceptance of input signals of varying signal ranges or other characteristics, according to yet another embodiment.

FIG. 6 is a circuit schematic that illustrates a CTSDM circuit 600 to provide improved acceptance of input signals of varying signal ranges or other characteristics, according to yet another embodiment. The CTSDM circuit 600 may be an embodiment of the CTSDM circuit 100, CTSDM circuit 300, CTSDM circuit 400, or CTSDM circuit 500, showing additional details of a configurable input circuit 610 according to the embodiment. In FIG. 6, a configurable input circuit 610 may include a plurality of pairs of input terminals 605 connected to differential input signal pairs VINP1 and VINM1, and VINP2 and VINM2, a pair of output terminals connected to summing nodes SUMP and SUMM, and a plurality of impedance branches (e.g., 611, 612, 613, and 614). Each of the plurality of pairs of the impedance branches may receive a differential input signal from a corresponding pair of input terminals 605, and provide a scaled version of the differential input signal to the output terminals, and consequently to the summing nodes (e.g., SUMP and SUMM). Each of the plurality of impedance branches 611, 612, 613, 614 may include an impedance, such as a resistor (e.g., R7, R8) having a predetermined resistance value.

In operation, in response to receipt of a first differential input signal VINP1 and VINM1 at a first pair of the input terminals 605 coupled with first impedance branches 611 and 612, the input circuit 610 may convert the first differential input signal VINP1 and VINM1 to a current signal at a scaling determined by the value of first resistors R7 of the first impedance branches 611 and 612. In response to receipt of a second differential input signal VINP2 and VINM2 at a second pair of the input terminals 605 coupled with second impedance branches 613 and 614, the input circuit 610 may convert the second input signal VINP2 and VINM2 to a current signal at a scaling determined by the value of second resistors R8 of the second impedance branches 613 and 614.

While the input circuit 610 uses impedances in separate impedance branches, each impedance branch connected in series with one of a plurality of input terminals 605, other embodiments of the input circuit 610, the input circuit 510, the input circuit 410, the input circuit 310, or the input circuit 110 may include other configurations to provide the selectable scaling of the input signal. For example, in other embodiments, the configurable input circuit may also provide scaled summing of a plurality of different input signals.

Figure 7:
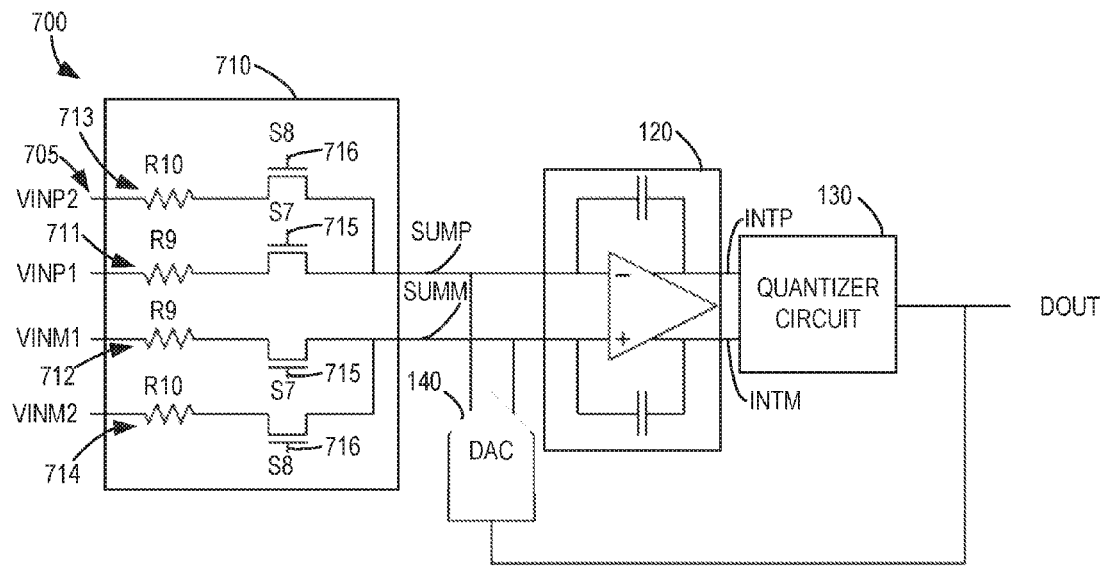
FIG. 7 is a circuit schematic that illustrates a CTSDM circuit to provide improved acceptance of input signals of varying signal ranges or other characteristics, according to yet another embodiment.

FIG. 7 is a circuit schematic that illustrates a CTSDM circuit 700 to provide improved acceptance of input signals of varying signal ranges or other characteristics, according to yet another embodiment. The CTSDM circuit 700 may be an embodiment of the CTSDM circuit 100, CTSDM circuit 300, CTSDM circuit 400, CTSDM circuit 500, or CTSDM circuit 600, showing additional details of a configurable input circuit 710 according to the embodiment. In FIG. 7, the configurable input circuit 710 may include a plurality of pairs of input terminals 705 connected to differential input signal pairs VINP1 and VINM1, and VINP2 and VINM2, a pair of output terminals connected to summing nodes SUMP and SUMM, and a plurality of impedance branches (e.g., 711, 712, 713, and 714). Each of the plurality of pairs of the impedance branches may receive a different differential input signal from a corresponding pair of input terminals 705, and provide a scaled version of the differential input signal to the output terminals, and consequently to the summing nodes (e.g., SUMP and SUMM). Each of the plurality of impedance branches 711, 712, 713, 714 may include an impedance, such as a resistor (e.g., R9, R10) having a predetermined resistance value, and a switch (e.g., S7, S8) connected in series between an input terminal and an output terminal.

In operation, in response to a first selection input 715 enabling first selection switches S7, and a second selection input 716 disabling second selection switches S8, the configurable input circuit 710 may convert the first input signal VINP1, VINM1 to a current signal at a scaling determined by the value of first resistors R9 of first impedance branches 711, 712. In response to the first selection input 715 disabling the first selection switches S7, and the second selection input 716 enabling the second selection switches S8, the configurable input circuit 710 may convert the second input signal VINP2, VINM2 to a current signal at a scaling determined by the value of second resistors R10 of second impedance branches 713, 714. In response to the first and second selection inputs 715, 716 enabling both the first and second selection switches S7, S8, the configurable input circuit 710 may convert the first and second input signals VINP1, VINM1 and VINP2, VINM2 to current signals at scalings respectively determined by the values of the first and second resistors R9, R10 of the first and second impedance branches 711-712 and 713-714, and deliver both the first and second scaled signals to the summing nodes SUMP, SUMM before the continuous-time integrator circuit 120, effecting a summing of both of these signals with the analog output provided by the DAC circuit 140.

An embodiment of the configurable input circuit 710 may also be configured to maintain the current drawn by the input terminals 705 at a substantially constant level, such as to within a predetermined current difference from a constant level. The current difference may be less than 10%, less than 5%, less than 1%, or less than another predetermined value as one of ordinary skill would consider to be substantially constant for the embodiment. Maintaining the input current at a substantially constant level may improve the performance of the embodiment of the CTSDM circuit 700.

Figure 8:
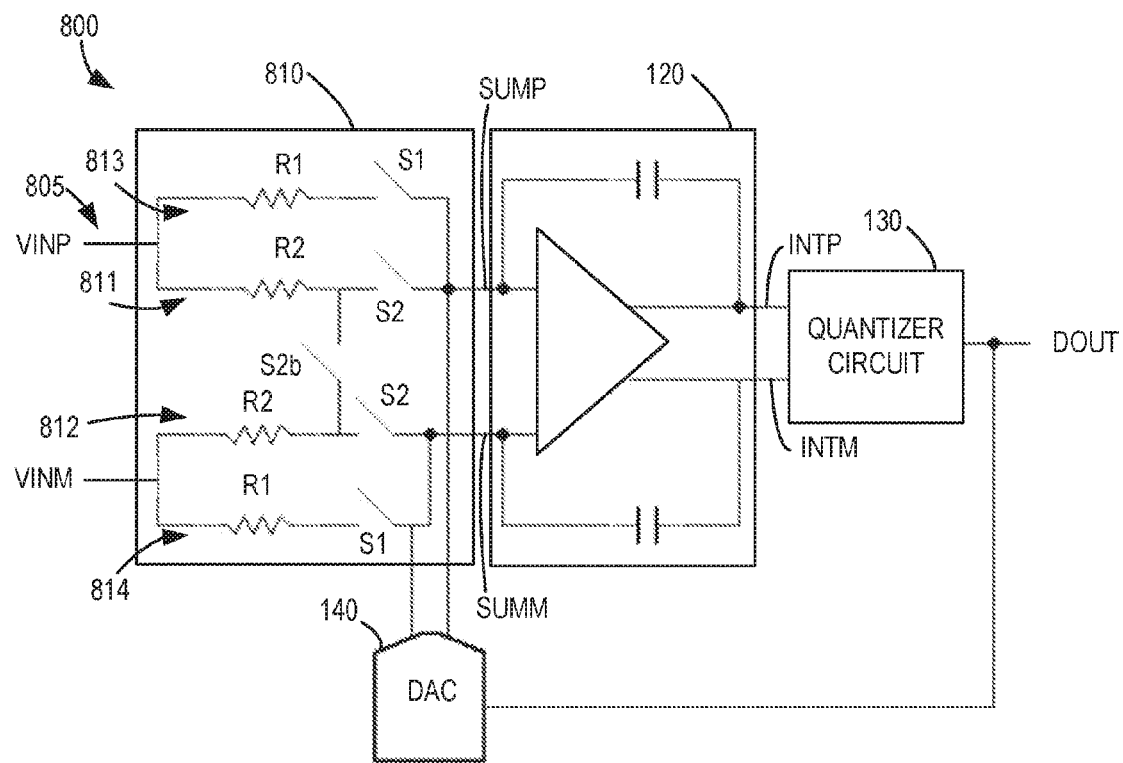
FIG. 8 is a circuit schematic that illustrates a CTSDM circuit to provide improved acceptance of input signals of varying signal ranges or other characteristics, according to yet another embodiment.

FIG. 8 is a circuit schematic that illustrates a CTSDM circuit 800 to provide improved acceptance of input signals of varying signal ranges or other characteristics, according to yet another embodiment. The CTSDM circuit 800 may be an embodiment of the CTSDM circuit 100, CTSDM circuit 300, CTSDM circuit 400, CTSDM circuit 500, CTSDM circuit 600, or CTSDM circuit 700 showing additional details of a configurable input circuit 810 according to the embodiment. In FIG. 8, the configurable input circuit 810 may include the same configuration as the configurable input circuit 310 in the embodiment of FIG. 3, but with an additional switch S2b connected between one impedance branch (e.g., 811, 812) of each one of the sets of impedance branches (e.g., 811, 813, and 812, 814) connected to each of the pair of input terminals 805. The configurable input circuit 810 may provide two or more scaling factors depending upon the states of the switches S1, S2, and S2b. The states of the switches S1, S2, and S2b may be changeable according to corresponding selection inputs. The selection inputs may be provided via a scaling control input signal. The states of switches S2 and S2b may be logical complements of one another. When the switch S2 is controlled to be closed, the switch S2b may be controlled to be open. When the switch S2 is controlled to be open, the switch S2b may be controlled to be closed.

The selection input provided to switch S2b may be an inverse of the selection input provided to the switches S2 of the impedance branches 811, 812 to which the additional switch S2b is connected. In some embodiments, the selection input provided to additional switch S2b may not be a precise inverse of the selection input provided to the switches S2, but may have an opposite binary value at most times.

In operation, in response to the first selection input enabling the first selection switches S1 and the second selection input disabling the second selection switches S2, the additional selection input controlling additional switch S2b may be enabled to electrically connect the second impedance branches 811, 812 together by connecting a side of each of the impedances R2 opposite of their respective branch's inputs VINP, VINM, so that the configurable input circuit 810 may draw an input current in both the first and second impedance branches 811-814 at levels in each of these branches similar to the levels at which these branches would draw in response to switches S1 and S2 all being enabled. In response to the first and second selection inputs enabling both the first and second selection switches S1 and S2, the additional selection input for the additional switch S2b may be disabled to electrically disconnect the second impedance branches 811 and 812 from each other, but the configurable input circuit 810 may again draw an input current in both the first and second impedance branches 811-814 at levels in each similar to the levels at which these branches would draw in response to being enabled. Thus, the configurable input circuit 810 may maintain the current drawn by the input terminals 805 at a substantially constant level regardless of whether only the first impedance branches 813, 814 are enabled or both the first and second impedance branches 811-814 are enabled.

As can be seen, the embodiment of FIG. 8 may be most effective at maintaining a substantially constant input current level for embodiments in which different scalings are provided by enabling different numbers of impedance branches at each input terminal. In such cases, the configurable input circuit 810 may maintain a substantially constant input current level by drawing current at a substantially constant level through all of the branches regardless of how many are enabled to perform scaling. However, other embodiments of the configurable input circuit 810 also may include circuitry for maintaining a substantially constant input current level. For example, the configurable input circuit of FIG. 8 may be modified to include an additional switch connected between each corresponding set of impedance branches (e.g., 811, 812, and 813, 814) connected between the input and output terminals. The corresponding selection input for each additional switch may be an inverse of the selection input provided to the switch of the impedance branch to which the additional switch is connected. In operation, such an embodiment may be effective at maintaining a substantially constant input current level when different scalings are provided by enabling different single impedance branch sets at the input terminals 805 by again drawing current at a substantially constant level through all of the branches regardless of which single sets are enabled to perform scaling.

Embodiments of the CTSDM circuits 100, 300, 400, 500, 600, 700, and 800, and configurable input circuits 110, 310, 410, 510, 610, 710, and 810 that utilize differential signals are discussed above; however corresponding single-ended embodiments may be provided for each of these embodiments by converting the circuits to corresponding single-ended circuits.

Figure 9:
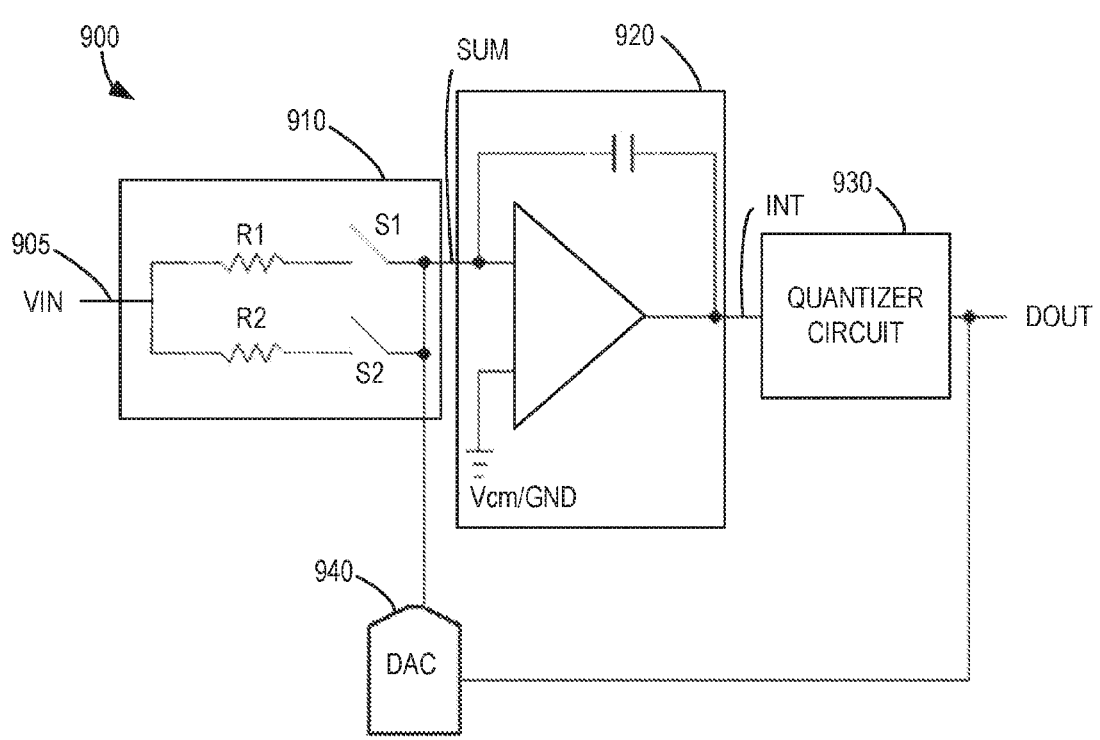
FIG. 9 is a circuit schematic that illustrates a single-ended embodiment of a CTSDM circuit corresponding to the differential embodiment of CTSDM circuit depicted in FIG. 3, according to an embodiment.

FIG. 9 is a circuit schematic that illustrates a single-ended embodiment of a CTSDM circuit 900 corresponding to the differential embodiment of CTSDM circuit 300 depicted in FIG. 3, according to an embodiment. The CTSDM circuit 900 of FIG. 9 includes single-ended embodiments of a configurable input circuit 910, continuous-time integrator circuit 920, quantizer circuit 930, and DAC circuit 940, each of which may be single-ended embodiments of the differential configurable input circuit 310, continuous-time integrator circuit 120, quantizer circuit 130, and DAC circuit 140. The configurable input circuit 910 differs from the configurable input circuit 310 in that the configurable input circuit 910 includes a single input terminal 905 connected to single-ended input signal VIN, and a single output terminal connected to summing node SUM. Summing node SUM additionally couples with a single-ended output of the DAC circuit 940 and a single-ended input of the continuous-time integrator circuit 920. The continuous-time integrator circuit 920 may be an embodiment of the differential continuous-time integrator circuit 320 except that the negative polarity terminal of the continuous-time integrator circuit 920 is coupled with a common mode voltage Vcm or ground GND and the continuous-time integrator circuit 920 produces a single-ended output INT which is input to the single-ended quantizer circuit 930. Each of the embodiments of FIGS. 1, 4, 5, 6, 7 and 8 may also be converted to single-ended embodiments in a similar manner by converting their corresponding configurable input circuit, continuous-time integrator circuit, quantizer circuit, and DAC circuit to corresponding single-ended circuits.

Figure 10:
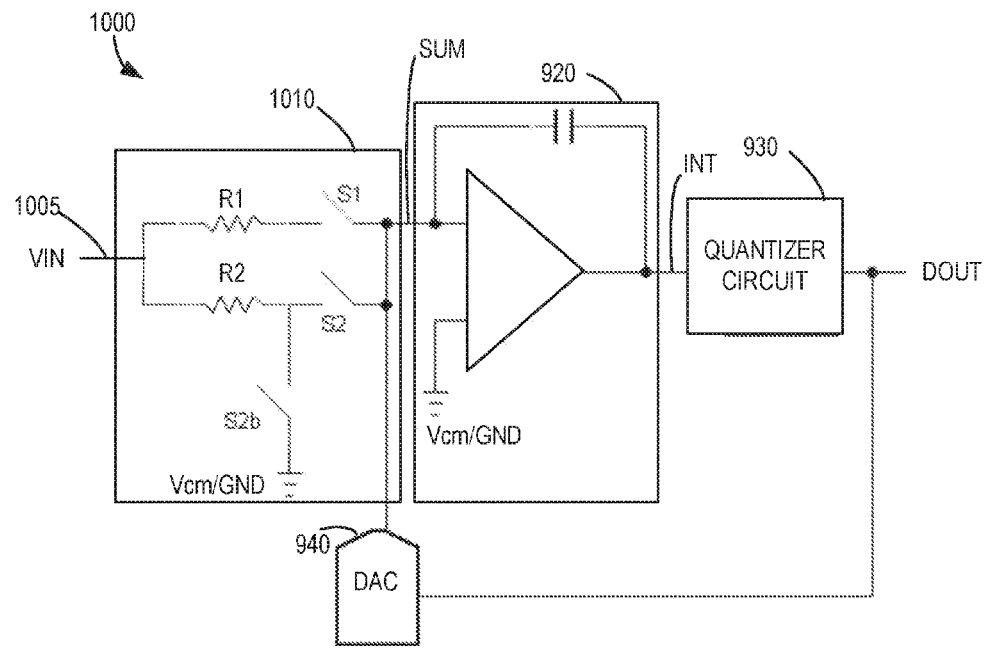
FIG. 10 is a circuit schematic that illustrates a single-ended embodiment of a CTSDM circuit corresponding to the differential embodiment of CTSDM circuit depicted in FIG. 8, according to an embodiment.

FIG. 10 is a circuit schematic that illustrates a single-ended CTSDM circuit 1000 corresponding to the differential CTSDM circuit 800 depicted in FIG. 8, according to an embodiment. The CTSDM circuit 1000 may be the result of converting the differential CTSDM circuit 800 of FIG. 8 to a single-ended embodiment by connecting the additional switch S2b between one of the impedance branches to a common mode voltage Vcm or ground GND. The CTSDM circuit 1000 may be an embodiment of the CTSDM circuit 900 of FIG. 9 with the additional switch S2b disposed between one of the impedance branches to ground GND or a common mode voltage Vcm. The CTSDM circuit 1000 thus includes a configurable input circuit 1010 that is an embodiment of the configurable input circuit 910 with the additional switch S2b between a junction of the resistor R2 and the switch S2 on a first side of the additional switch S2b, and ground GND or common mode voltage Vcm on a second side of the additional switch S2b.

The configurable input circuit 1010 may provide two or more scaling factors depending upon the states of the switches S1, S2, and S2b. The states of the switches S1, S2, and S2b may be changeable according to a scaling control input signal. The states of switches S2 and S2b may be logical complements of one another. When the switch S2 is controlled to be closed, the switch S2b may be controlled to be open. When the switch S2 is controlled to be open, the switch S2b may be controlled to be closed. In this way, the configurable input circuit 1010 may ensure a substantially constant current through the input terminal 1005 of the configurable input circuit 1010 across two or more scaling factors.

Any of the above-discussed embodiments may include any number of a plurality of impedance branches to achieve a corresponding number of different scalings. For example, the configurable input circuit 310 of FIG. 3 may include any number of a plurality of impedance branches between the positive input and positive output terminals, and a corresponding number of a plurality of impedance branches between the negative input and negative output terminals, to achieve a corresponding number of different scalings. Other differential embodiments discussed herein may be similarly modified. Likewise, single-ended embodiments may be similarly modified to include any number of a plurality of impedance branches between the input and output terminals to achieve a corresponding number of different scalings.

Alternatively or in addition to including embodiments of the configurable input circuit to provide scaling as discussed above, embodiments of the CTSDM circuit may also include embodiments of a configurable DAC circuit to provide scaling of the configurable DAC circuit output to enable embodiments of the CTSDM circuit to accept input signals of varying signal ranges while still providing a signal to the summing node before the continuous-time integrator circuit at a level within operational specifications for this circuit.

Figure 11:
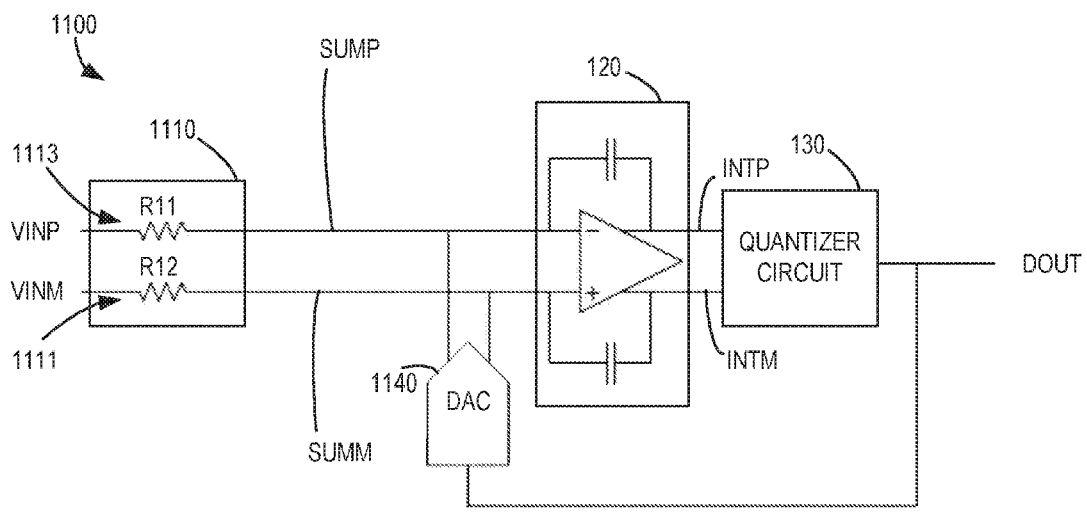
FIG. 11 is a circuit schematic that illustrates a CTSDM circuit to provide improved acceptance of input signals of varying signal ranges or other characteristics, according to yet another embodiment.

FIG. 11 is a circuit schematic that illustrates a CTSDM circuit 1100 to provide improved acceptance of input signals of varying signal ranges or other characteristics, according to yet another embodiment. The CTSDM circuit 1100 may be an embodiment of the CTSDM circuit 100, CTSDM circuit 300, CTSDM circuit 400, CTSDM circuit 500, CTSDM circuit 600, CTSDM circuit 700 or CTSDM circuit 800 showing additional details of a configurable input circuit 1110 according to the embodiment. The CTSDM circuit 1100 may include an input circuit 1110, a continuous-time integrator circuit 120, a quantization circuit 130, and a configurable DAC circuit 1140. The configurable DAC circuit 1140 may receive the quantized digital output signal from the quantizer circuit 130, and provide a scaled analog signal to the summing nodes SUMP, SUMM based on the received quantized digital output signal. The configurable DAC 1140 may provide configurable scaling to the DAC output analog signal to enable other components of the CTSDM circuit 1100 to operate within predetermined signal range specifications.

Embodiments of the configurable DAC 1140 may include a plurality of selectable scaling elements to provide scaling to the DAC output signal output to the summing nodes SUMP, SUMM. In various embodiments, the selectable scaling elements may include selectable impedances.

Figure 12:
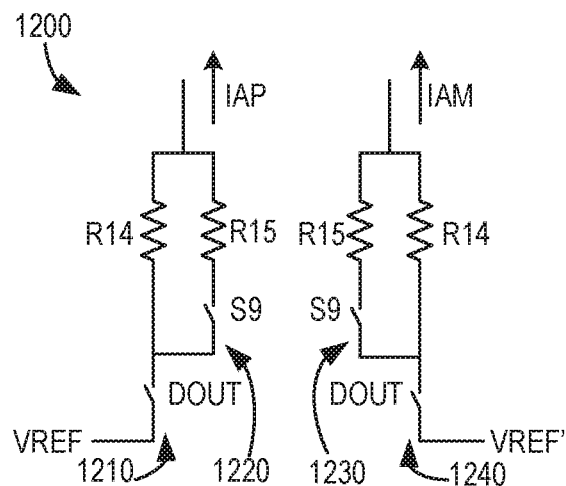
FIG. 12 is a circuit schematic that illustrates a configurable DAC circuit that implements a scaled 1 bit digital to analog conversion using selectable impedances, according to an embodiment.

FIG. 12 is a circuit schematic that illustrates a configurable DAC circuit 1200 that implements a scaled 1-bit digital to analog conversion using selectable impedances, according to an embodiment. The configurable DAC circuit 1200 may be an embodiment of the configurable DAC circuit 1140. In FIG. 12, the configurable DAC circuit 1200 may include a terminal to receive the digital output DOUT from the quantizer circuit (e.g., quantizer circuit 130), a pair of terminals to receive a pair of reference voltages VREF and VREF', a pair of terminals to provide output currents IAP, IAM to the summing nodes (e.g., SUMP and SUMM) of the CTSDM circuit (e.g., CTSDM circuit 1110), and a plurality of selectable impedance branches (e.g., 1210, 1220, 1230, 1240). The selectable impedance branches may include a first branch (e.g., 1210, 1240) including a first impedance, such as a resistor (e.g., R14) having a predetermined resistance value, and a switch enabled and disabled as a function of the digital output DOUT, and a second branch (e.g., 1220, 1230) including a second impedance, such as a resistor (e.g., R15) having a predetermined resistance value, and a switch (e.g., S9) enabled and disabled as a function of a selection input. As depicted in FIG. 12, the first impedance branch (e.g., 1210, 1240) may include the impedance (e.g., R14) and switch connected in series between the reference voltage (e.g., VREF, VREF') and output terminal, and the second impedance branch (e.g., 1220, 1230) may include the switch (e.g., S9) and impedance (e.g., R15) connected in parallel with the impedance (e.g., R14) of the first branch (e.g., 1210, 1240). However, in other embodiments, other configurations of the impedance branches (e.g., 1210-1240) are also possible to achieve the functionality discussed herein.

In operation, in response to the digital output DOUT enabling the switches in the first impedance branches (e.g., 1210, 1240) and the selection input disabling the switches S9 in the second impedance branches (e.g., 1220, 1230), the configurable DAC circuit 1200 may convert the digital output DOUT to current signals IAP, IAM at current values having a scaling determined by the value of resistors R14 of the first impedance branches. In response to the digital output DOUT enabling the switches in the first impedance branches (e.g., 1210, 1240) and the selection input enabling the switches S9 in the second impedance branches (e.g., 1220, 1230), the configurable DAC circuit 1200 may convert the digital output DOUT to current signals IAP, IAM at current values having a scaling determined by the value of resistors R14, R15 of both the first and second impedance branches (e.g., 1210-1240). In response to the digital output DOUT disabling the switches in the first impedance branches (e.g., 1210, 1240), the configurable DAC circuit 1200 may convert the digital output DOUT to zero valued current signals IAP, IAM.

In various embodiments of the configurable DAC circuits 1140 and 1200, the selectable scaling elements may include current sources.

Figure 13:
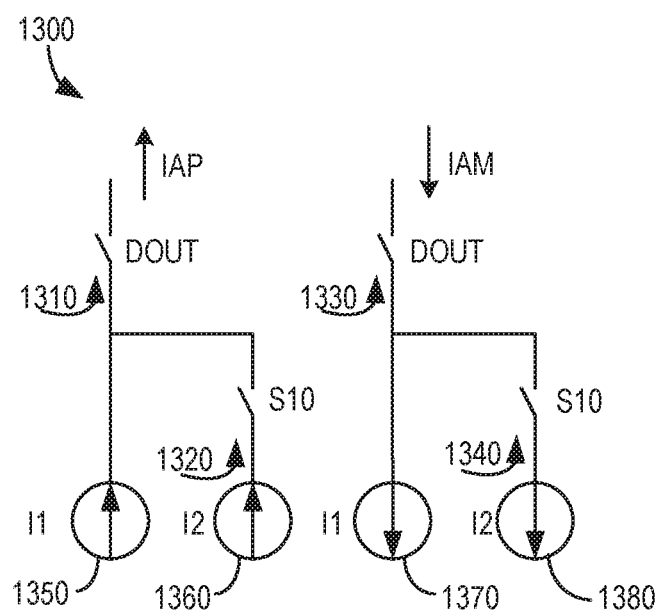
FIG. 13 is a circuit schematic that illustrates a configurable DAC circuit that implements a scaled 1 bit digital to analog conversion using selectable current sources, according to an embodiment.
Figures 14A, 14B, 14C, 14D:
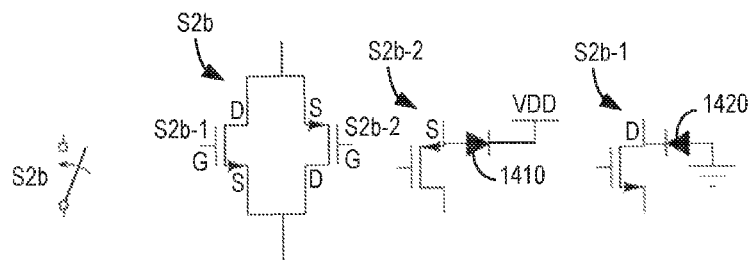
FIGS. 14A, 14B, 14C, and 14D are circuit schematics that illustrate an embodiment of a switch as a transmission gate including parasitic diodes to limit voltages to prevent high voltage breakdown, according to an embodiment.

FIG. 13 is a circuit schematic that illustrates a configurable DAC circuit that implements a scaled 1 bit digital to analog conversion using selectable current sources, according to an embodiment. The configurable DAC circuit 1300 may be an embodiment of the configurable DAC circuit 1140. In FIG. 13, the configurable DAC circuit 1300 may include a terminal to receive the digital output DOUT from the quantizer circuit (e.g., quantizer circuit 130), a pair of terminals to provide output currents IAP, IAM to the summing nodes (e.g., SUMP and SUMM) of the CTSDM circuit (e.g., CTSDM circuit 1110), and a plurality of selectable current branches (e.g., 1310, 1320, 1330, 1340). The selectable current branches (e.g., 1310, 1330) connected to a corresponding output terminal may include a first branch (e.g., 1310) including a first current source 1350 and a switch enabled and disabled as a function of the digital output DOUT, and a second branch (e.g., 1320) including a second current source 1360 and a switch (e.g., S10) enabled and disabled as a function of a selection input. As depicted in FIG. 13, the first current branch 1310 may include the current source 1350 and switch enabled and disabled as a function of the digital output DOUT connected in series to the output terminal that provides current IAP, and the second current branch 1320 may include the current source 1360 and switch S10 connected in parallel with the current source 1350 of the first branch 1310. However, in other embodiments, other configurations of the current branches are also possible to achieve the functionality discussed herein.

In operation, the configurable DAC circuit 1300 may convert the digital output DOUT to current signals IAP, IAM scaled to a degree based on the selection input controlling switches S10. For example, in response to the digital output DOUT enabling the switches in the first current branches (e.g., 1310, 1330) and the selection input disabling the switches S10 in the second current branches (e.g., 1320, 1340), the configurable DAC circuit 1300 may convert the digital output DOUT to current signals IAP, IAM at current values having a scaling determined by the first current source (e.g., 1350, 1370) providing current I1. In response to the digital output DOUT enabling the switches in the first impedance branches (e.g., 1310, 1330) and the selection input enabling the switches S10 in the second current branches (e.g., 1320, 1340), the configurable DAC circuit 1300 may convert the digital output DOUT to current signals IAP, IAM at current values having a scaling determined by the current sources (e.g., 1350, 1360, 1370, 1380) that provide currents I1, I2 of both the first and second current branches (e.g., 1310-1340). In response to the digital output DOUT disabling the switches in the first current branches (e.g., 1310, 1330), the configurable DAC circuit 1300 may convert the digital output DOUT to zero valued current signals IAP, IAM.

In FIG. 11, the input circuit 1110 may include impedance branches including an impedance, such as a resistor (e.g., R11, R12) having a predetermined resistance value, connected between input and output terminals. Alternatively, the input circuit 1110 may include any of the embodiments of the configurable input circuits 110, 310, 410, 510, 610, 710, or 810 discussed above.

Embodiments of the configurable DAC circuits 1140, 1200, and 1300 may provide n-bit conversion by expanding the circuits to corresponding n-bit circuits, as would be understood by one of ordinary skill in the art in view of the teachings herein.

Embodiments of the configurable DAC circuits 1140, 1200, and 1300 may provide single-ended conversion by reducing the circuits to corresponding single-ended circuits, as would be understood by one of ordinary skill in the art in view of the teachings herein.

Embodiments of the configurable DAC circuits 1140, 1200, and 1300 may provide scaled voltage mode outputs by converting the circuits to corresponding voltage mode circuits, as would be understood by one of ordinary skill in the art in view of the teachings herein.

Any of the above-discussed configurable DAC circuit embodiments may include any number of a plurality of impedance or current branches to achieve a corresponding number of different scalings.

FIGS. 14A, 14B, 14C, and 14D are circuit schematics that illustrate an embodiment of a switch S2*b* as a transmission gate including transistors S2*b*-1 and S2*b*-2 having parasitic diodes 1410, 1420 to limit voltages to prevent high voltage breakdown, according to an embodiment. The switch S2*b* may be an embodiment of the switch S2*b* illustrated in FIGS. 8 and 10. In the illustrated embodiment, switch S2*b* includes an n-type metal-oxide-semiconductor field-effect transistor (nMOSFET) S2*b*-1 and a p-type MOSFET (pMOSFET) S2*b*-2 with the source S of one coupled to the drain D of the other and vice versa. Use of the phrase "metal-oxide-semiconductor" refers generally to a FET device having a conductive gate structure and does not require the FET device to include a metal gate, in particular. The source S of the pMOSFET S2*b*-2 may be coupled with an anode of a parasitic diode 1410, and a cathode of the parasitic diode 1410 may be coupled with a voltage rail VDD. The drain D of the nMOSFET S2*b*-1 may be coupled with a cathode of a parasitic diode 1420, and an anode of the parasitic diode 1420 may be coupled with ground. The switch S2*b* so configured provides fault protection for the configurable input circuit (e.g., configurable input circuits 810 and 1010) in which the switch S2*b* is incorporated.

For example, in an embodiment which does not include a switch S2*b*, should one of the input terminals of the configurable input circuit become disconnected and float (e.g., an electrical connection with INP is lost), all of the switches in the configurable input circuit could potentially be subjected to a high voltage greater than the configurable input circuit is able to handle, and thus the switches could breakdown and be damaged. However, in an embodiment of the configurable input circuit that does include the switch S2*b* (e.g., configurable input circuits 810 and 1010), the switch S2*b* may protect all of the switches in the configurable input circuit. In particular, the parasitic diodes 1410 and/or 1420 of the switch S2*b* may activate and limit the voltages experienced by the switches in the configurable input circuit by shunting current to the voltage rails and ground. Thus, embodiments of the switch S2*b* may limit voltages within the configurable input circuit to stay within compliance limits for the configurable input circuit. Such compliance limits may be determined by the semiconductor process used for fabricating the configurable input circuit.

Figure 15:
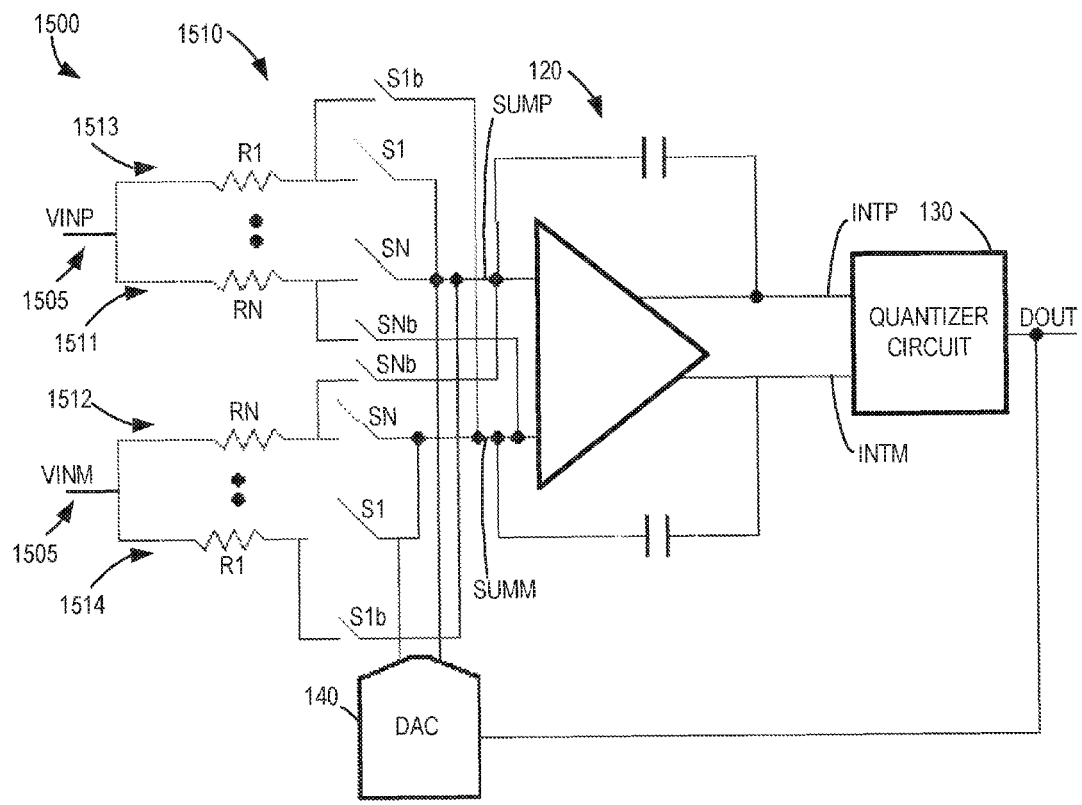
FIG. 15 is a circuit schematic that illustrates a CTSDM circuit to provide improved acceptance of input signals of varying signal ranges or other characteristics, according to yet another embodiment.

FIG. 15 is a circuit schematic that illustrates a CTSDM circuit 1500 to provide improved acceptance of input signals of varying signal ranges or other characteristics, according to yet another embodiment. The CTSDM circuit 1500 may be an embodiment of the CTSDM circuit 100, CTSDM circuit 300, CTSDM circuit 400, CTSDM circuit 500, CTSDM circuit 600, or CTSDM circuit 700 showing additional details of a configurable input circuit 1510 according to the embodiment. In FIG. 15, the configurable input circuit 1510 may include a similar configuration as the configurable input circuit 810 in the embodiment of FIG. 3, but with a total of N sets of impedance branches (e.g., 1511-1514) each having a corresponding impedance (e.g., resistors R1, . . . , RN) in series with a switch (e.g., switches S1, . . . SN) plus an additional switch (e.g., S1*b*, . . . , SNb) connected between each one (e.g., 1513) of each impedance branch pair (e.g., 1511, 1512, and 1513, 1514) at a position between the corresponding impedance (e.g., R1) and switch (e.g., S1), and a summing node (e.g., SUMP, SUMM) coupled with the output terminal of the configurable input circuit 1510 corresponding to an opposite one of each impedance branch pair (e.g., 1514). Each additional switch (e.g., S1*b*, . . . , SNb) may be an embodiment of the switch S2*b* illustrated in FIGS. 14A-14D. The selection input transmitted to each additional switch (e.g., S1*b*, . . . , SNb) may be an inverse of the selection input provided to the other switches (e.g., S1, . . . , SN) of the impedance branch to which the additional switch (e.g., S1*b*, . . . , SNb) is connected. In some embodiments, the selection input transmitted to each additional switch (e.g., S1*b*, . . . , SNb) may not be a precise inverse of the selection input provided to the other corresponding switches (e.g., S1, . . . , SN), but may have an opposite binary value at most times.

In operation, in response to the first selection input enabling the first selection switches S1 and the second through Nth selection inputs disabling the second through Nth selection switches S2 (not shown in FIG. 15) through SN, the additional selection input controlling additional switches S2*b* (not shown in FIG. 15) may be enabled to electrically connect the second through Nth impedance branches (e.g., 1511, 1512) to the summing nodes SUMP and SUMM corresponding to an opposite output terminal than the input terminal corresponding to the respective connected impedance branch, so that the configurable input circuit 1510 may draw an input current in all the impedance branches (e.g., 1511-1514) at levels in each of these branches similar to the levels at which these branches would draw in response to all selection switches S1-SN being enabled in an embodiment without the additional switches (e.g., S1*b*, . . . , SNb).

In response to the first through Nth selection inputs enabling all selection switches S1-SN, the additional selection inputs for the additional switches (e.g., S1*b*, . . . , SNb) may be disabled to electrically disconnect the impedance branches from the summing nodes SUMP and SUMM corresponding to an opposite output terminal than the input terminal corresponding to the respective disconnected impedance branch, but the configurable input circuit 1510 may again draw an input current in all the impedance branches 1511-1514 at levels in each similar to the levels at which these branches would draw in response to being enabled. Thus, the configurable input circuit 1510 may maintain the current drawn by input terminals 1505 at a substantially constant level regardless of whether only the first impedance branches 1513, 1514 are enabled or all the impedance branches 1511-1514 are enabled.

As can be seen, the embodiment of FIG. 15 may be particularly effective at maintaining a substantially constant input current level for embodiments in which different scalings are provided by enabling different numbers of impedance branches at each input terminal. In such cases, the configurable input circuit 1510 may maintain a substantially constant input current level by drawing current at a substantially constant level through all of the branches regardless of how many are enabled to perform scaling.

The CTSDM circuit 1500 may provide zero gain when half of the selection switches (e.g., S1, . . . , SN) are set to off, while the other half are set to on. When more than half of the selection switches are set to off, the CTSDM circuit 1500 may provide attenuation to the input differential signal VINP, VINM, for example, for use in applications having a high input voltage range. When more than half of the selection switches are set to on, the CTSDM circuit 1500 may provide gain (e.g., amplification) to the input differential signal VINP, VINM, for example, for use in applications having a low input voltage range. The configurable input circuit 1510 provides that every selection switch (e.g., S1, . . . , SN) has a complementary additional switch (e.g., S1*b* . . . . , SNb) connecting the corresponding impedance (e.g., resistors R1, . . . , RN) to a summing node attached to an opposite polarity output terminal relative to the polarity of the differential input signal received by the impedance. Using the configurable input circuit 1510, the CTSDM circuit 1500 may be configured to have both amplification (gain)-only and attenuation-only modes. In addition, the input load to the CTSDM circuit 1500 may be ensured to be substantially constant across the different amplification, zero gain, and attenuation modes. Furthermore, the CTSDM circuit 1500 supports high voltage analog inputs, where voltages of the analog input terminals 1505 of the configurable input circuit 1510 exceed the range of voltage rails of the CTSDM circuit 1500, because the impedances (e.g., R1, . . . , RN) may always be coupled be with a summing node rather than floating, regardless of the gain or attenuation of the CTSDM circuit 1500.

Embodiments of the CTSDM circuit 1500 and the configurable input circuit 1510 that utilize differential signals are discussed above; however corresponding single-ended embodiments may be provided for each of these embodiments by converting the circuits to corresponding single-ended circuits, as discussed previously with respect to the embodiments of the CTSDM circuits 100, 300, 400, 500, 600, 700, and 800 and configurable input circuits 110, 310, 410, 510, 610, 710, and 810 that utilize differential signals.

Figure 16:
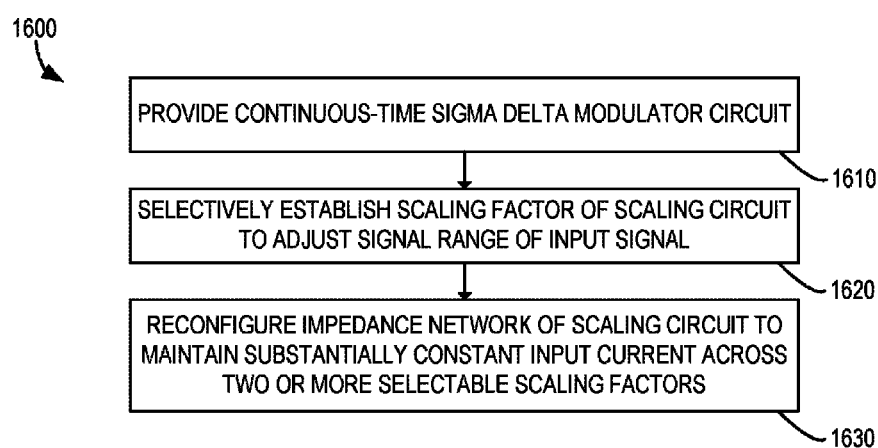
FIG. 16 is a flow diagram that illustrates a method of scaling an input signal to an integrating amplifier, according to an embodiment.

FIG. 16 is a flow diagram that illustrates a method 1600 of scaling an input signal to an integrating amplifier, according to an embodiment. The method 1600 may be performed by an embodiment of a CTSDM circuit as disclosed herein. In an operation 1610, a CTSDM circuit is provided. The CTSDM circuit may include a scaling circuit having an analog signal input and having a scaled output coupled with a summing node, an integrating amplifier circuit having an amplifier input coupled with the summing node and having an amplifier output, a quantizer circuit having a quantizer input coupled with the amplifier output and having a quantizer output to provide a digital output signal, and a DAC circuit having a digital input coupled with the quantizer output and having an analog output coupled with the summing node.

In an operation 1620, a scaling factor of the scaling circuit is selectively established to adjust a signal range of an input signal provided at the analog signal input. The scaling factor may be adjusted to provide a range-adjusted input signal to the summing node. The selectable scaling factor may be selectable according to a scaling control input signal.

In an embodiment, selectively establishing the scaling factor in the operation 1620 may include controlling an impedance between the analog signal input and the summing node by one or more switches according to the scaling control input signal. The scaling control input signal may include a control signal coupled with each of the one or more switches to control a state of the switch. The scaling control input signal may be provided by a controller programmed to control the impedance values and consequently scaling factors of the scaling circuit.

In an operation 1630, an impedance network of the scaling circuit may be reconfigured to maintain substantially constant input current at the analog signal input across two or more selectable scaling factors. The reconfiguration of the impedance network may be performed by at least one switch, which may be controlled according to the scaling control input signal.

In an embodiment, reconfiguring the impedance network in operation 1630 may include closing a first switch disposed between an impedance coupled with the analog input and a ground while opening a second switch disposed between the impedance and the summing node.

Reconfiguring the impedance network in operation 1630 may also include maintaining a conducting path from the analog signal input through an impedance coupled with analog signal input by closing a protection switch coupled with the impedance when a voltage exceeding a threshold is detected by a parasitic diode of the protection switch.

In embodiments in which the CTSDM circuit includes a differential circuit and the analog signal input of the scaling circuit includes a differential analog signal input, the scaling circuit may include both a first and a second analog signal input as well as both a first and a second scaled output respectively coupled with a first and a second summing node. The integrating amplifier may include a differential amplifier input having both a first and a second amplifier input respectively coupled with the first and second summing nodes, as well as a differential amplifier output having both first and second amplifier outputs coupled with a differential input to the quantizer circuit. The quantizer's differential input may include both a first and a second quantizer input. In addition, the DAC circuit may include a differential analog output coupled having both first and second analog outputs respectively with the first and second summing nodes. In the differential embodiments, the scaling factor may adjust a signal range of the differential input signal provided at both the first and second analog signal inputs to provide a range-adjusted differential input signal to both the first and second summing nodes. Also, in the differential embodiments, reconfiguring the impedance network of the scaling circuit may maintain a substantially constant input current at both the first and second analog signal inputs of the differential signal input across two or more selectable scaling factors.

In a differential embodiment, reconfiguring the impedance network of the scaling circuit may include closing a first switch disposed between a first impedance coupled with the first analog input and a second impedance coupled with the second analog input while opening a second switch disposed between the first impedance and the first summing node and opening a third switch disposed between the second impedance and the second summing node.

In another differential embodiment, reconfiguring the impedance network of the scaling circuit may include closing a first switch disposed between a first impedance coupled with the first analog input and the second summing node and closing a second switch disposed between a second impedance coupled with the second analog input and the second summing node while opening a third switch disposed between the first impedance and the first summing node and opening a fourth switch disposed between the second impedance and the second summing node.

Any feature of any of the embodiments described herein may optionally be used in combination with any other embodiment, as would be understood by one of ordinary skill in the art in view of the teachings herein. Also, any of the embodiments described herein may optionally include any subset of the components or features discussed herein, as would be understood by one of ordinary skill in the art in view of the teachings herein.

VARIOUS NOTES & EXAMPLES

Example 1 is a continuous-time sigma delta modulator (CTSDM) circuit, the CTSDM circuit comprising: an integrating amplifier circuit having a first amplifier input and a first amplifier output; a quantizer circuit having a first quantizer input coupled with the first amplifier output and having a quantizer output to provide a digital output signal; a digital to analog converter (DAC) circuit having a digital input coupled with the quantizer output and having a first analog output coupled with the first amplifier input at a first summing node; and a scaling circuit coupled between a first analog signal input and the first summing node, the scaling circuit: configured to provide a selectable scaling factor to adjust a signal range of an input signal provided at the analog signal input to provide a range-adjusted input signal to the first summing node, the selectable scaling factor selectable according to a scaling control input signal; and comprising at least one switch arranged to reconfigure an impedance network to maintain a substantially constant input current at the analog signal input across two or more selectable scaling factors, the at least one switch controlled according to the scaling control input signal.

In Example 2, the subject matter of Example 1 optionally includes wherein the impedance network comprises a first resistance element and a first switch disposed in series between the first analog signal input and the first summing node, a state of the first switch being changeable according to the scaling control input signal.

In Example 3, the subject matter of Example 2 optionally includes wherein the impedance network further comprises a second switch disposed between a junction of the first resistance element and the first switch on a first side of the second switch, and ground on a second side of the second switch, a state of the second switch being changeable according to the scaling control input signal.

In Example 4, the subject matter of Example 3 optionally includes wherein the scaling circuit is configured to close the second switch when opening the first switch and open the second switch when closing the first switch.

In Example 5, the subject matter of any one or more of Examples 3-4 optionally includes wherein the impedance network further comprises a second resistance element and a third switch disposed in series between the first analog signal input and the first summing node and in parallel with the first resistance element and the first switch, a state of the third switch being changeable according to the scaling control input signal.

In Example 6, the subject matter of any one or more of Examples 1-5 optionally includes wherein the integrating amplifier circuit further has a second amplifier input and a second amplifier output; the quantizer circuit further has a second quantizer input coupled with the second amplifier output; the DAC circuit further has a second analog output coupled with the second amplifier input at a second summing node; the impedance network comprises: a first resistance element and a first switch disposed in series between the first analog signal input and the first summing node; a second resistance element and a second switch disposed in series between a second analog signal input and the second summing node; and a third switch disposed between a junction of the first resistance element and the first switch on a first side of the third switch, and between a junction of the second resistance element and the second switch on a second side of the third switch; and wherein a state of each of the first switch, the second switch, and the third switch is changeable according to the scaling control input signal.

In Example 7, the subject matter of Example 6 optionally includes wherein the scaling circuit is configured to close the third switch when opening the first switch and the second switch, and open the third switch when closing the first switch and the second switch.

In Example 8, the subject matter of any one or more of Examples 6-7 optionally includes wherein the impedance network further comprises: a third resistance element and a fourth switch disposed in series between the first analog signal input and the first summing node and in parallel with the first resistance element and the first switch; and a fourth resistance element and a fifth switch disposed in series between the second analog signal input and the second summing node and in parallel with the second resistance element and the second switch; wherein a state of the fourth switch and a state of the fifth switch are changeable according to the scaling control input signal.

In Example 9, the subject matter of Example 8 optionally includes wherein the scaling circuit is configured to close the fourth switch when closing the fifth switch and open the fourth switch when opening the fifth switch.

In Example 10, the subject matter of any one or more of Examples 6-9 optionally includes wherein the scaling circuit is configured to close the second switch when closing the first switch and open the second switch when opening the first switch.

In Example 11, the subject matter of any one or more of Examples 6-10 optionally includes a first integrator capacitor coupled between the first amplifier input and the first amplifier output, and a second integrator capacitor coupled between the second amplifier input and the second amplifier output.

In Example 12, the subject matter of any one or more of Examples 1-11 optionally includes wherein the integrating amplifier circuit further has a second amplifier input and a second amplifier output; the quantizer circuit further has a second quantizer input coupled with the second amplifier output; the DAC circuit further has a second analog output coupled with the second amplifier input at a second summing node; the impedance network comprises: a first resistance element and a first switch disposed in series between the first analog signal input and the first summing node; a second resistance element and a second switch disposed in series between a second analog signal input and the second summing node; a third switch disposed between a junction of the first resistance element and the first switch on a first side of the third switch, and the second summing node on a second side of the third switch; and a fourth switch disposed between a junction of the second resistance element and the second switch on a first side of the fourth switch, and the first summing node on a second side of the fourth switch; and wherein a state of each of the first switch, the second switch, the third switch, and the fourth switch is changeable according to the scaling control input signal.

In Example 13, the subject matter of Example 12 optionally includes wherein the scaling circuit is configured to close the third switch and fourth switches when opening the first and second switches, and open the third and fourth switches when closing the first and second switches.

Example 14 is a method of scaling an input signal to an integrating amplifier, the method comprising: providing a CTSDM circuit including a scaling circuit having a first analog signal input and having a first scaled output coupled with a first summing node, an integrating amplifier circuit having a first amplifier input coupled with the first summing node and having a first amplifier output, a quantizer circuit having a first quantizer input coupled with the first amplifier output and having a quantizer output to provide a digital output signal, and a digital to analog converter (DAC) circuit having a digital input coupled with the quantizer output and having a first analog output coupled with the first summing node; selectively establishing a scaling factor of the scaling circuit to adjust a signal range of an input signal provided at the first analog signal input to provide a range-adjusted input signal to the first summing node, the selectable scaling factor selectable according to a scaling control input signal; reconfiguring an impedance network of the scaling circuit by at least one switch to maintain a substantially constant input current at the first analog signal input across two or more selectable scaling factors, the at least one switch controlled according to the scaling control input signal.

In Example 15, the subject matter of Example 14 optionally includes wherein selectively establishing the scaling factor of the scaling circuit comprises controlling an impedance between the first analog signal input and the first summing node by one or more switches according to the scaling control input signal.

In Example 16, the subject matter of any one or more of Examples 14-15 optionally includes wherein reconfiguring the impedance network comprises closing a first switch disposed between a first impedance coupled with the first analog input and a ground while opening a second switch disposed between the first impedance and the first summing node.

In Example 17, the subject matter of any one or more of Examples 14-16 optionally includes wherein the scaling circuit further has a second analog signal input and has a second scaled output coupled with a second summing node, the integrating amplifier circuit further has a second amplifier input coupled with the second summing node and has a second amplifier output, the quantizer circuit further has a second quantizer input coupled with the second amplifier output, and the DAC circuit further has a second analog output coupled with the second summing node; the scaling factor is further to adjust a signal range of an input signal provided at the second analog signal input to provide a range-adjusted input signal to the second summing node; and reconfiguring the impedance network of the scaling circuit is further to maintain a substantially constant input current at the second analog signal input across two or more selectable scaling factors.

In Example 18, the subject matter of Example 17 optionally includes wherein reconfiguring the impedance network of the scaling circuit comprises closing a first switch disposed between a first impedance coupled with the first analog input and a second impedance coupled with the second analog input while opening a second switch disposed between the first impedance and the first summing node and opening a third switch disposed between the second impedance and the second summing node.

In Example 19, the subject matter of any one or more of Examples 17-18 optionally includes wherein reconfiguring the impedance network of the scaling circuit comprises closing a first switch disposed between a first impedance coupled with the first analog input and the second summing node and closing a second switch disposed between a second impedance coupled with the second analog input and the second summing node while opening a third switch disposed between the first impedance and the first summing node and opening a fourth switch disposed between the second impedance and the second summing node.

In Example 20, the subject matter of any one or more of Examples 14-19 optionally includes wherein reconfiguring the impedance network of the scaling circuit comprises maintaining a conducting path from the first analog signal input through an impedance coupled with first analog signal input by closing a protection switch coupled with the impedance when a voltage exceeding a threshold is detected by a parasitic diode of the protection switch.

Each of the non-limiting examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

For example, while the impedance elements and the switches are shown in one order between the input terminals and the summing nodes in the drawings, this should not be construed as limiting, because in various embodiments, the impedance elements and the switches may be disposed in a different order while maintaining the same functional performance, according to the understanding of one of ordinary skill in the art in view of the teachings herein. In addition, a single impedance element in the drawings may be replaced by a plurality of different impedance elements while maintaining a same functional performance, and a single switch in the figures may be replaced by a plurality of different switches while maintaining a same functional performance, according to the understanding of one of ordinary skill in the art in view of the teachings herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A continuous-time sigma delta modulator (CTSDM) circuit to scale an input signal to be within a predetermined desired range of values, the CTSDM circuit comprising:
   a scaling circuit to adjust a signal range of an input analog signal according to a shared selectable scaling factor and output a range-adjusted analog signal; and
   an impedance network to maintain a substantially constant current flow of the input analog signal by communicating the shared scaling factor to an amplifier circuit.

2. The CTSDM circuit of claim 1, further comprising:
   an integrating amplifier circuit to amplify the range-adjusted analog signal and output an amplified analog signal;
   a quantizer circuit to convert the amplified analog signal to a digital signal; and
   a digital to analog converter (DAC) circuit to convert the digital signal output from the quantizer circuit to an intermediate analog signal to be summed with the range-adjusted analog signal at an input to the integrating amplifier circuit.

3. The CTSDM circuit of claim 2, wherein the impedance network comprises a first resistance element and a first switch disposed in series, a state of the first switch being changeable according to the selectable scaling factor.

4. The CTSDM circuit of claim 3, wherein the impedance network further comprises a second switch disposed between a junction of the first resistance element and the first switch on a first side of the second switch, and ground on a second side of the second switch, a state of the second switch being changeable according to the selectable scaling factor.

5. The CTSDM circuit of claim 4, wherein the scaling circuit is configured to close the second switch when opening the first switch and open the second switch when closing the first switch.

6. The CTSDM circuit of claim 4, wherein the impedance network further comprises a second resistance element and a third switch disposed in series and collectively in parallel with the first resistance element and the first switch, a state of the third switch being changeable according to the selectable scaling factor.

7. The CTSDM circuit of claim 1, wherein
   the input analog signal, range-adjusted analog signal, and amplified analog signal are differential signals;
   the integrating amplifier circuit has a first amplifier input and a second amplifier input to receive the range-adjusted analog signal, and has a first amplifier output and a second amplifier output to output the amplified analog signal;
   the quantizer circuit has a first quantizer input coupled with the first amplifier output and a second quantizer input coupled with the second amplifier output to receive the amplified analog signal;
   the DAC circuit has a first analog output coupled with the first amplifier input at a first summing node and a second analog output coupled with the second amplifier input at a second summing node;
   the impedance network comprises:
   a first resistance element and a first switch disposed in series between a first analog signal input and the first summing node;
   a second resistance element and a second switch disposed in series between a second analog signal input and the second summing node; and
   a third switch disposed between a junction of the first resistance element and the first switch on a first side of the third switch, and between a junction of the second resistance element and the second switch on a second side of the third switch; and
   wherein a state of each of the first switch, the second switch, and the third switch is changeable according to the selectable scaling factor.

8. The CTSDM circuit of claim 7, wherein the scaling circuit is configured to close the third switch when opening the first switch and the second switch, and open the third switch when closing the first switch and the second switch.

9. The CTSDM circuit of claim 7, wherein the impedance network further comprises:
   a third resistance element and a fourth switch disposed in series between the first analog signal input and the first summing node and in parallel with the first resistance element and the first switch; and
   a fourth resistance element and a fifth switch disposed in series between the second analog signal input and the second summing node and in parallel with the second resistance element and the second switch;
   wherein a state of the fourth switch and a state of the fifth switch are changeable according to the selectable scaling factor.

10. The CTSDM circuit of claim 9, wherein the scaling circuit is configured to close the fourth switch when closing the fifth switch and open the fourth switch when opening the fifth switch.

11. The CTSDM circuit of claim 7, wherein the scaling circuit is configured to close the second switch when closing the first switch and open the second switch when opening the first switch.

12. The CTSDM circuit of claim 7, further comprising a first integrator capacitor coupled between the first amplifier input and the first amplifier output, and a second integrator capacitor coupled between the second amplifier input and the second amplifier output.

13. The CTSDM circuit of claim 1, wherein
   the input analog signal, range-adjusted analog signal, and amplified analog signal are differential signals;
   the integrating amplifier circuit has a first amplifier input and a second amplifier input to receive the range-adjusted analog signal and a first amplifier output and a second amplifier output to output the amplified analog signal;
   the quantizer circuit has a first quantizer input coupled with the first amplifier output and a second quantizer input coupled with the second amplifier output to receive the amplified analog signal;
   the DAC circuit has a first analog output coupled with the first amplifier input at a first summing node and a second analog output coupled with the second amplifier input at a second summing node;
   the impedance network comprises:
   a first resistance element and a first switch disposed in series between a first analog signal input and the first summing node;
   a second resistance element and a second switch disposed in series between a second analog signal input and the second summing node;
   a third switch disposed between a junction of the first resistance element and the first switch on a first side of the third switch, and the second summing node on a second side of the third switch; and
   a fourth switch disposed between a junction of the second resistance element and the second switch on a first side of the fourth switch, and the first summing node on a second side of the fourth switch; and wherein a state of each of the first switch, the second switch, the third switch, and the fourth switch is changeable according to the selectable scaling factor.

14. The CTSDM circuit of claim 13, wherein the scaling circuit is configured to close the third switch and fourth switches when opening the first and second switches, and open the third and fourth switches when closing the first and second switches.

15. A method of scaling an input signal to an integrating amplifier to be within a predetermined desired range of values, the method comprising:
selectively establishing a scaling factor of a shared scaling circuit to adjust a signal range of an input analog signal;
adjusting the signal range of the input analog signal by the scaling circuit according to the scaling factor to output a range-adjusted analog signal;
reconfiguring an impedance network of the scaling circuit to maintain a substantially constant current flow of the input analog signal across two or more selectable scaling factors by communicating the shared scaling factor to each of first and second differential branches of the integrating amplifier circuit.

16. The method of claim 15, wherein selectively establishing the scaling factor of the scaling circuit comprises controlling an impedance of the impedance network by one or more switches according to the selectable scaling factor.

17. The method of claim 15, wherein reconfiguring the impedance network comprises closing a first switch disposed between a first impedance coupled with a first analog signal input that receives the input analog signal and a ground while opening a second switch disposed between the first impedance and an output of the scaling circuit.

18. The method of claim 15, wherein reconfiguring the impedance network of the scaling circuit comprises maintaining a conducting path to receive the input analog signal through an impedance by closing a protection switch coupled with the impedance when a voltage exceeding a threshold is detected by a parasitic diode of the protection switch.

19. The method of claim 15, further comprising:
amplifying the range-adjusted analog signal by an integrating amplifier circuit to output an amplified analog signal;
converting the amplified analog signal to a digital signal by a quantizer circuit;
converting the digital signal output from the quantizer circuit to an intermediate analog signal by a digital to analog converter (DAC) circuit; and
summing the intermediate analog signal with the range-adjusted analog signal at an input to the integrating amplifier circuit.

20. The CTSM circuit of claim 1, wherein the shared scaling factor is communicated to corresponding input branches of the amplifier circuit, wherein the amplifier circuit comprises a differential amplifier circuit.

21. The CTSM circuit of claim 3, wherein the shared scaling factor is communicated to each of first and second differential branches of the impedance network that are respectively connected to differential summing junctions of the amplifier circuit, wherein the amplifier circuit comprises a differential integration amplifier circuit.

22. The method of claim 15, comprising reconfiguring the impedance network of the scaling circuit o maintain substantially constant current flow of the input analog signal across two or more selectable scaling factors by communicating the shared scaling factor to each of first and second differential branches of the impedance network that are respectively connected to differential summing junctions of a differential integration amplifier circuit.

23. The method of claim 21, wherein the input analog signal and the range-adjusted analog signal are differential signals.

24. A scaling circuit for scaling an input signal to an integrating amplifier, the scaling circuit comprising:
means for adjusting a signal range of an input analog signal according to a shared selectable scaling factor and output a range-adjusted analog signal;
means for maintaining a substantially constant current flow of the input analog signal drawn at one or more input terminals and communicating the shared scaling factor to first and second input branches of an amplifier circuit.

25. The circuit of claim 24, wherein the amplifier circuit includes a differential integration amplifier circuit.

26. The circuit of claim 25, included in or used in combination with a continuous-time sigma delta modulator circuit.

27. The method of claim 23, wherein reconfiguring the impedance network of the scaling circuit comprises closing a first switch disposed between a first impedance that receives a first polarity of the input analog signal and a second impedance that receives a second polarity of the input analog signal while opening a second switch disposed between the first impedance and a first summing node at a first input of the integrating amplifier circuit and opening a third switch disposed between the second impedance and a second summing node at a second input of the integrating amplifier circuit.

28. The method of claim 23, wherein reconfiguring the impedance network of the scaling circuit comprises closing a first switch disposed between a first impedance that receives a first polarity of the input analog signal and a second summing node at a second input of the integrating amplifier circuit and closing a second switch disposed between a second impedance that receives a second polarity of the input analog signal and the second summing node while opening a third switch disposed between the first impedance and a first summing node at a first input of the integrating amplifier circuit and opening a fourth switch disposed between the second impedance and the second summing node.

* * * * *